United States Patent

Tomiha et al.

(10) Patent No.: US 10,241,166 B2
(45) Date of Patent: Mar. 26, 2019

(54) MAGNETIC RESONANCE IMAGING APPARATUS

(71) Applicant: Toshiba Medical Systems Corporation, Otawara-shi (JP)

(72) Inventors: Sadanori Tomiha, Nasushiobara (JP); Koji Akita, Minato (JP); Hideo Kasami, Minato (JP); Kazuya Okamoto, Saitama (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 877 days.

(21) Appl. No.: 14/629,688

(22) Filed: Feb. 24, 2015

(65) Prior Publication Data

US 2015/0253404 A1 Sep. 10, 2015

(30) Foreign Application Priority Data

Mar. 7, 2014 (JP) ................................. 2014-045645

(51) Int. Cl.
 *G01R 33/36* (2006.01)
 *G01R 33/3415* (2006.01)

(52) U.S. Cl.
 CPC ...... *G01R 33/3692* (2013.01); *G01R 33/3415* (2013.01)

(58) Field of Classification Search
 CPC .................. G01R 33/3692; G01R 33/3415
 See application file for complete search history.

(56) References Cited

U.S. PATENT DOCUMENTS

| 5,318,025 | A | 6/1994 | Dumoulin et al. |
| 6,236,205 | B1 * | 5/2001 | Ludeke ............ A61B 5/06 324/300 |
| 6,377,837 | B1 | 4/2002 | Coutts et al. |
| 7,391,214 | B2 * | 6/2008 | Adachi ............. G01R 33/34 324/318 |
| 7,714,576 | B2 * | 5/2010 | Van Den Brink ........... G01R 33/3415 324/309 |
| 7,751,865 | B2 * | 7/2010 | Jascob ............ A61B 5/06 128/899 |

(Continued)

FOREIGN PATENT DOCUMENTS

| EP | 0 844 488 A1 | 5/1998 |
| JP | 6-22938 A | 2/1994 |

(Continued)

OTHER PUBLICATIONS

Japanese Office Action dated Aug. 26, 2018 in Japanese Patent Application No. 2014-255167, 4 pages.

*Primary Examiner* — Dixomara Vargas
(74) *Attorney, Agent, or Firm* — Oblon, McClelland, Maier & Neustadt, L.L.P.

(57) ABSTRACT

A magnetic resonance imaging apparatus according to an embodiment includes a wireless communication unit, a radio frequency (RF) coil, and a specifying unit. The wireless communication unit includes an antenna and that transmits and receives a wireless signal through the antenna. The RF coil includes one or more antennas and that receives the wireless signal and to respond to the received wireless signal through the one or more antennas. The specifying unit that specifies the position and the orientation of the RF coil on the basis of a response result indicated by the response from the RF coil.

8 Claims, 7 Drawing Sheets

(56) References Cited

U.S. PATENT DOCUMENTS

| | | | | |
|---|---|---|---|---|
| 8,271,069 B2* | 9/2012 | Jascob | ............... | A61B 5/06 128/899 |
| 8,502,540 B2* | 8/2013 | Nakanishi | ............... | G01R 33/3692 324/318 |
| 8,549,732 B2* | 10/2013 | Burg | ............... | A61B 5/06 29/602.1 |
| 8,644,907 B2* | 2/2014 | Hartmann | ............... | A61B 5/062 600/424 |
| 8,754,644 B2* | 6/2014 | Trakic | ............... | G01R 33/422 324/307 |
| 8,855,742 B2* | 10/2014 | Foo | ............... | A61B 5/062 600/417 |
| 8,880,149 B2* | 11/2014 | Barbot | ............... | A61B 5/062 600/407 |
| 8,885,904 B2* | 11/2014 | Darrow | ............... | G01R 33/543 382/131 |
| 9,013,186 B2* | 4/2015 | Biber | ............... | G01R 33/34 324/309 |
| 9,037,213 B2* | 5/2015 | Roth | ............... | G01R 33/287 600/410 |
| 9,494,667 B2* | 11/2016 | Morich | ............... | G01R 33/481 |
| 9,496,732 B2* | 11/2016 | Partovi | ............... | H02J 7/0042 |
| 9,504,530 B2* | 11/2016 | Hartmann | ............... | A61B 5/062 |
| 9,638,769 B2* | 5/2017 | Wirtz | ............... | G01R 33/287 |
| 9,662,512 B2* | 5/2017 | Vahala | ............... | A61N 5/1049 |
| 2011/0274183 A1 | 11/2011 | Wang | | |

FOREIGN PATENT DOCUMENTS

| | | |
|---|---|---|
| JP | 10-179553 A | 7/1998 |
| JP | 2006-297067 | 11/2006 |
| JP | 2007-203036 | 8/2007 |
| JP | 2010-29644 | 2/2010 |
| JP | 2010-537699 A | 12/2010 |

* cited by examiner

MAGNETIC RESONANCE IMAGING APPARATUS

CROSS-REFERENCE TO RELATED APPLICATION

This application is based upon and claims the benefit of priority from Japanese Patent Application No. 2014-45645, filed on Mar. 7, 2014, the entire contents of all of which are incorporated herein by reference.

FIELD

Embodiments described herein relate generally to a magnetic resonance imaging apparatus.

BACKGROUND

A magnetic resonance imaging apparatus (hereinafter, "MRI apparatus") is configured to emit a radio frequency (RF) pulse onto an examined subject (hereinafter, "patient") and to receive echo signals emitted from the patient upon receiving the RF pulse, with the use of an RF coil. Further, the MRI apparatus is configured to generate a cross-sectional image of the patient by analyzing the received echo signals.

In a conventional example, an image is generated by using a plurality of RF coils. In that situation, each of the RF coils is individually connected to the apparatus main body. The larger the number of connected RF coils is, the larger the number of connection cables is, and the more complicated handling of the RF coils becomes. For this reason, development has progressed on wireless RF coils that are configured to transmit echo signals received thereby to the apparatus main body via a wireless communication.

Incidentally, a plurality of RF coils may be used at the same time in some situations. In those situations, if the RF coils were of a wired type, it would be possible to specify the installation position of each of the RF coils, on the basis of the connection destination ports to which the wired connections are made on the gantry side, when the RF coils are attached to the patient P. However, if the RF coils are of a wireless type, it is not possible to specify the installation position of each of the RF coils, because no such connections to the ports are made.

DETAILED DESCRIPTION

A magnetic resonance imaging apparatus according to an embodiment includes a wireless communication unit, a radio frequency (RF) coil, and a specifying unit. The wireless communication unit includes an antenna and is configured to transmit and receive a wireless signal through the antenna. The RF coil includes one or more antennas and is configured to receive the wireless signal and to respond to the received wireless signal through the one or more antennas. The specifying unit is configured to specify the position and the orientation of the RF coil on the basis of a response result indicated by the response from the RF coil.

Exemplary embodiments of a magnetic resonance imaging apparatus will be explained below, with reference to the accompanying drawings.

First Embodiment

Figure 1:
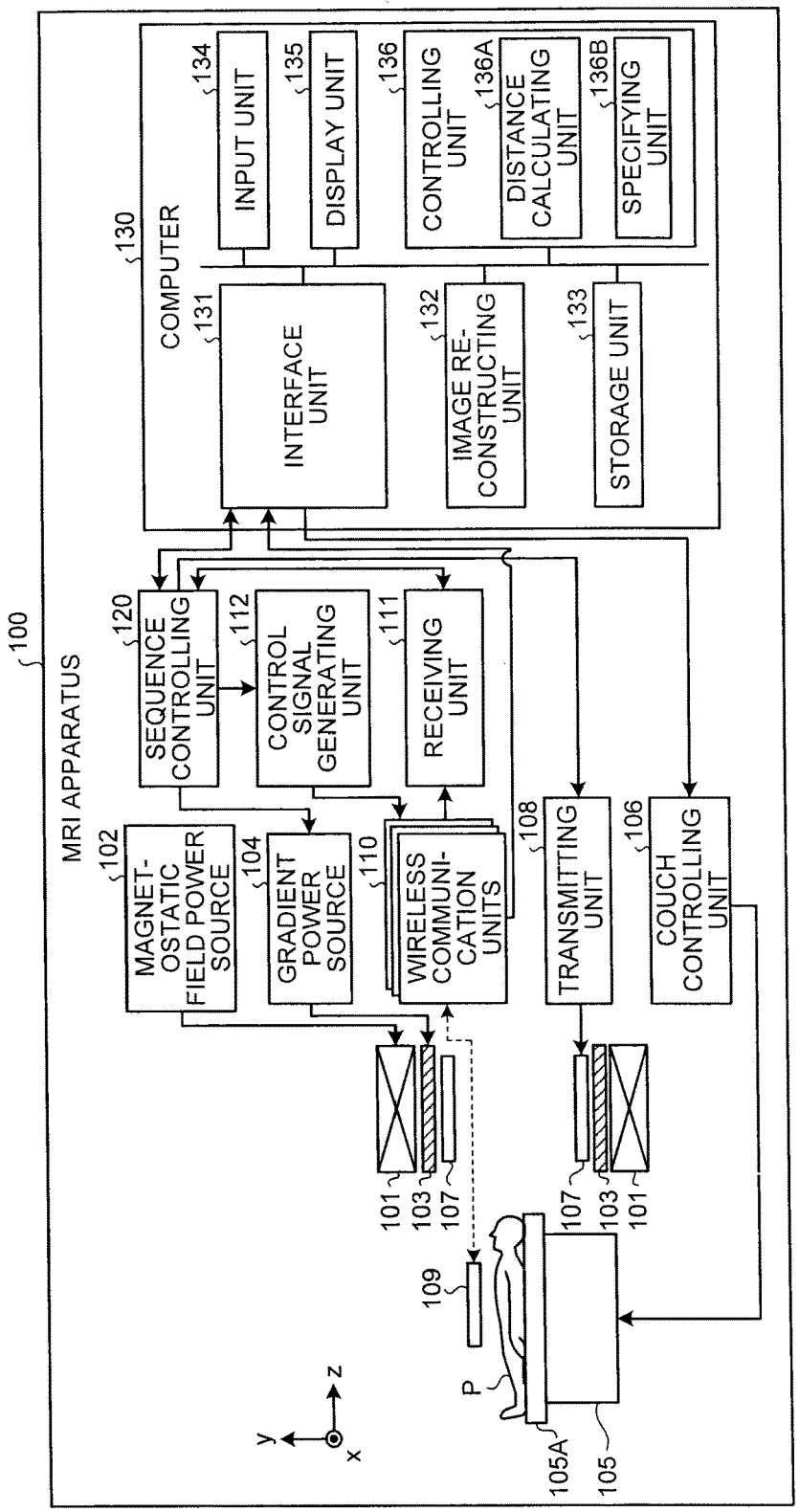
FIG. 1 is a functional block diagram of an MRI apparatus according to a first embodiment.

FIG. 1 is a functional block diagram of a Magnetic Resonance Imaging (MRI) apparatus 100 according to a first embodiment. In the following sections, magnetic resonance imaging apparatuses will be referred to as MRI apparatuses.

As illustrated in FIG. 1, the MRI apparatus 100 includes a magnetostatic field magnet 101, a magnetostatic field power source 102, a gradient coil 103, a gradient power source 104, a couch 105, a couch controlling unit 106, a whole body (WB) coil 107, a transmitting unit 108, a reception coil 109, wireless communication units 110, a receiving unit 111, a control signal generating unit 112, a sequence controlling unit 120, and a computer 130. The MRI apparatus 100 does not include an examined subject (such as a human body; hereinafter, "patient") P. The configuration illustrated in FIG. 1 is merely an example.

The magnetostatic field magnet 101 is a magnet formed in the shape of a substantially hollow circular cylinder and is configured to generate a magnetostatic field in the space on the inside thereof. The magnetostatic field magnet 101 may be configured by using, for example, a superconductive magnet and is configured to be excited by receiving a supply of electric current from the magnetostatic field power source 102. The magnetostatic field power source 102 is configured to supply the electric current to the magnetostatic field magnet 101. Alternatively, the magnetostatic field magnet 101 may be configured by using a permanent magnet. In that situation, the MRI apparatus 100 does not need to include the magnetostatic field power source 102. Further, the magnetostatic field power source 102 may be provided separately from the MRI apparatus 100.

The gradient coil 103 is a coil formed in the shape of a substantially hollow circular cylinder and is disposed on the inside of the magnetostatic field magnet 101. The gradient coil 103 is formed by combining three coils corresponding to x-, y-, and z-axes that are orthogonal to one another. These three coils individually receive a supply of electric current from the gradient power source 104 and generate gradient magnetic fields of which the magnetic field intensities change along the x-, y-, and z-axes. The gradient magnetic fields on the x-, y-, and z-axes that are generated by the gradient coil 103 correspond to, for example, a slice encoding gradient magnetic field $G_{SE}$ (or a slice selecting gradient magnetic field $G_{SS}$), a phase encoding gradient magnetic field $G_{PE}$, and a frequency encoding gradient magnetic field $G_{RO}$, respectively. The gradient power source 104 is configured to supply the electric current to the gradient coil 103.

The couch 105 includes a couchtop 105A on which the patient P is placed. Under control of the couch controlling unit 106, while the patient P is placed thereon, the couchtop 105A is inserted into the hollow (i.e., an image taking opening) of the gradient coil 103. Normally, the couch 105 is provided so that the longitudinal direction thereof extends parallel to the central axis of the magnetostatic field magnet 101. Under control of the computer 130, the couch controlling unit 106 is configured to drive the couch 105 so that the couchtop 105A moves in longitudinal directions and in up-and-down directions.

The WB coil 107 is provided on the inside of the gradient coil 103 and is configured to generate a radio frequency magnetic field by receiving a supply of a radio frequency (RF) pulse from the transmitting unit 108. The transmitting unit 108 is configured to supply the RF pulse corresponding to a Larmor frequency determined by the type of targeted atoms and the magnetic field intensities, to the WB coil 107.

The reception coil 109 is configured to receive magnetic resonance signals (hereinafter, "MR signals", as necessary). For example, the reception coil 109 is a Radio Frequency (RF) coil attached to the patient and is configured with a surface coil to be attached to the body surface of the patient or a Phased Array Coil (PAC) structured with a plurality of surface coils.

In this situation, the reception coil 109 according to the first embodiment is configured to transmit the received MR signals via a wireless communication. For example, when having received the MR signals, the reception coil 109 transmits the received MR signals to the wireless communication units 110 provided on the main body side of the MRI apparatus 100 via a wireless communication. The number of wireless communication units 110 is two or more, and each of the wireless communication units 110 is configured to output the MR signals received from the reception coil 109 via the wireless communication, to the receiving unit 111. Next, with reference to FIG. 2, a specific example will be explained in which the MR signals received by the reception coil 109 are transmitted to the wireless communication units 110 provided on the main body side of the MRI apparatus 100 via the wireless communication.

Figure 2:
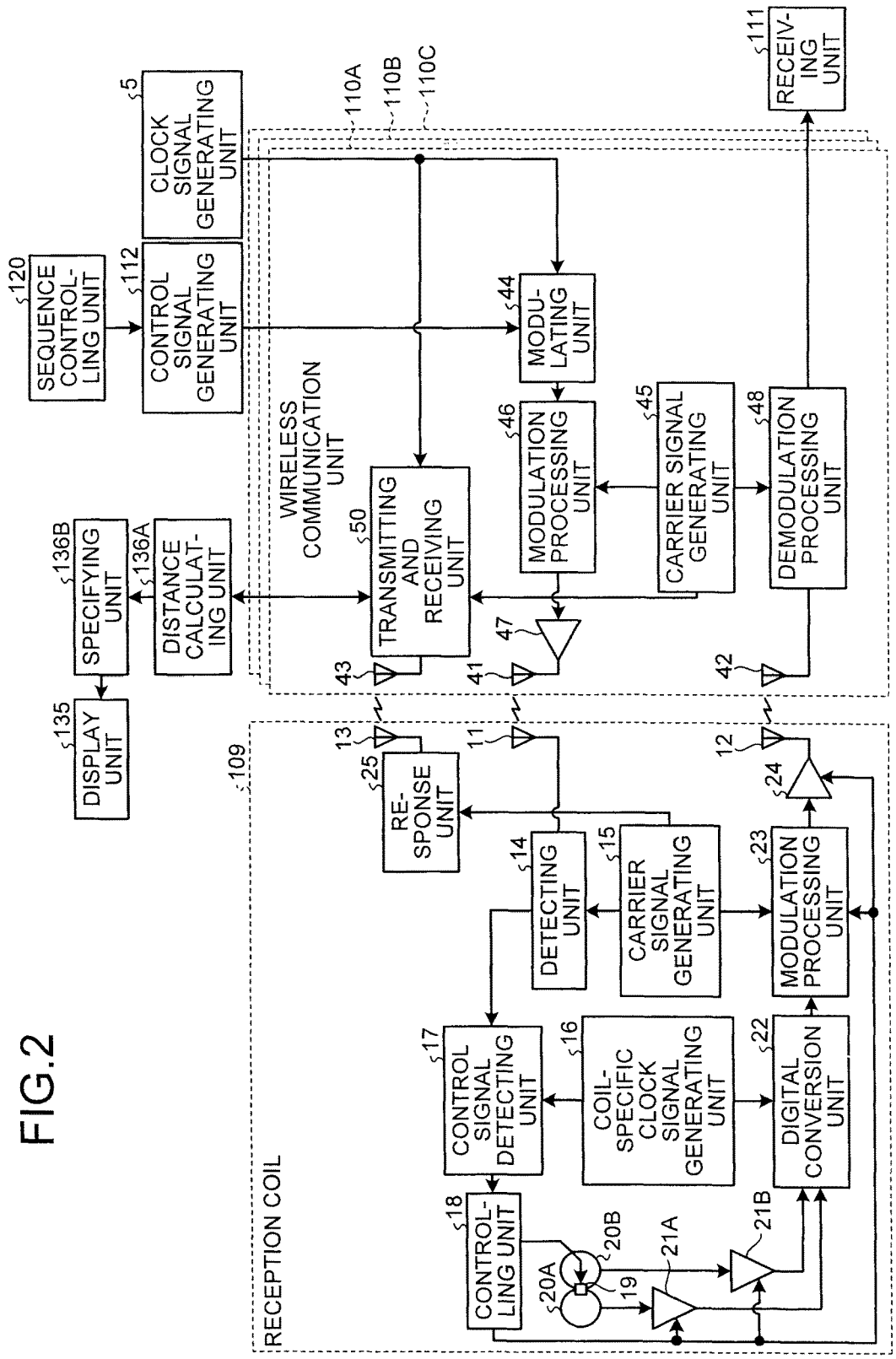
FIG. 2 is a functional block diagram of a detailed configuration of the MRI apparatus according to the first embodiment.

FIG. 2 is a functional block diagram of a detailed configuration of the MRI apparatus 100 according to the first embodiment. As illustrated in FIG. 2, the MRI apparatus 100 includes the reception coil 109 and wireless communication units 110A, 110B, and 110C, for the purpose of transmitting and receiving the echo signals via the wireless communication. FIG. 2 illustrates the example in which the MRI apparatus 100 includes the three wireless communication units, namely, 110A, 110B, and 110C; however, possible embodiments are not limited to this example. Further, when the wireless communication units are generally referred to without any distinction therebetween, the wireless communication units 110A, 110B, and 110C will be referred to as the "wireless communication units 110".

For example, the reception coil 109 includes wireless antennas 11, 12, and 13, a detecting unit 14, a carrier signal generating unit 15, a coil-specific clock signal generating unit 16, a control signal detecting unit 17, a controlling unit 18, an active decoupling circuit 19, coil elements 20A and 20B, preamplifiers 21A and 21B, a digital conversion unit 22, a modulation processing unit 23, an amplifier 24, and a response unit 25. In this situation, each of the wireless antennas 11, 12, and 13 is an example of the antenna.

Further, for example, the wireless communication unit 110A includes wireless antennas 41, 42, and 43, a modulating unit 44, a carrier signal generating unit 45, a modulation processing unit 46, an amplifier 47, a demodulation processing unit 48, an analog conversion unit 49, and a transmitting and receiving unit 50. Because the configuration of each of the wireless communication units 110B and 110C is the same as that of the wireless communication unit 110A, the explanation thereof will be omitted. In this situation, each of the wireless antennas 41, 42, and 43 is an example of the antenna.

In this situation, each of the wireless communication units 110 operates by receiving a supply of clock signals from a clock signal generating unit 5. The clock signal generating unit 5 is configured to generate a reference clock signal that exhibits amplitude fluctuations repeated at a predetermined frequency. For example, the clock signal generating unit 5 is an oscillator configured by using a quartz crystal resonator and is provided in the computer 130 (not illustrated in FIG. 1).

As illustrated in FIG. 2, in the reception coil 109, the MR signals emitted from the patient P are received by the coil elements 20A and 20B and are amplified by the preamplifiers 21A and 21B. After that, the MR signals received by the coil elements 20A and 20B are input to the digital conversion unit 22. Typically, each of the coil elements 20A and 20B is a one-loop coil included in the reception coil; however, possible embodiments are not limited to this configuration. Each of the coil elements 20A and 20B may represent a set of coils configured with a plurality of loops.

The digital conversion unit 22 is configured to generate MR data (called a sampling process), by performing an Analog/Digital (A/D) conversion on the input MR signals, while using the clock signals supplied from the coil-specific clock signal generating unit 16.

Subsequently, the modulation processing unit 23 is configured to generate an MR-data transfer-purpose signal by performing a modulating process on the MR data generated by the digital conversion unit 22, while using a carrier frequency generated by the carrier signal generating unit 15. After that, the modulation processing unit 23 is configured to amplify the MR-data transfer-purpose signal by using the amplifier 24 and to transmit the amplified MR-data transfer-purpose signal from the wireless antenna 12.

After that, in each of the wireless communication units 110, the wireless antenna 42 is configured to receive the MR-data transfer-purpose signal transmitted from the wireless antenna 12. Subsequently, the demodulation processing unit 48 is configured to demodulate the MR-data transfer-purpose signal received by the wireless antenna 42 into digital MR data, by using a carrier frequency generated by the carrier signal generating unit 45. After that, the receiving unit 111 is configured to transmit the demodulated MR data to an image reconstructing unit 132, via the sequence controlling unit 120.

In the MRI apparatus 100, the reception coil 109 transfers the echo signals via the wireless communication in the manner described above. The configuration illustrated in FIG. 2 is merely an example. In another example, the reception coil 109 may include a Band-Pass Filter (BPF) for a filtering purpose provided between the preamplifiers 21A, 21B and the digital conversion unit 22. Further, the number of coil elements 20A and 20B does not necessarily have to be two; it is sufficient if at least one of the coil elements is provided. Further, the number of coil elements may vary depending on the type of the reception coil 109.

The WB coil 107 and the reception coil 109 described above are merely examples. In another example, the reception coil 109 may be a transmission/reception purpose RF coil, such as a head coil, that further has a function of transmitting an RF pulse. In other words, it is sufficient if the reception coil 109 is an RF coil that has at least the receiving function and the wireless communication function. Further, an RF coil configured to transfer the MR signals via a wired communication may be used together, separately from the reception coil 109. Further, the WB coil 107 may have a function of receiving the MR signals and may receive the MR signals emitted from the patient P and output the received MR signals to the receiving unit 111. In that situation, the communication between the WB coil 107 and the receiving unit 111 is realized by a wired communication.

Returning to the description of FIG. 1, the receiving unit 111 is configured to detect the MR signals output from each of the wireless communication units 110 and to generate MR data on the basis of the detected MR signals. More specifically, the receiving unit 111 generates the MR data by applying a digital conversion to the MR signals output from each of the wireless communication units 110. Further, the receiving unit 111 is configured to transmit the generated MR data to the sequence controlling unit 120.

The control signal generating unit 112 is configured to generate control signals that control operations of the reception coil 109. For example, the control signal generating unit 112 causes the active decoupling circuit 19 included in the reception coil 109 to perform an active decoupling process, for the purpose of protecting the reception-purpose RF coil from the transmission RF pulse. The active decoupling process is performed, for example, by shifting the resonance frequencies of the RF coil elements at the transmission timing of the transmission RF pulse, so as to make it difficult to be impacted by the power of the transmission RF pulse. In that situation, the control signal generating unit 112 generates control signals used for performing the active decoupling process at the transmission timing of the transmission RF pulse and transmits the generated control signals to the reception coil 109. Subsequently, the control signal generating unit 112 causes the reception coil 109 to perform the active decoupling process.

Next, an example in which the control signal generating unit 112 causes the active decoupling process to be performed will specifically be explained, with reference to FIG. 2. First, the sequence controlling unit 120 determines the type of the transmission RF pulse and the generation timing of the RF pulse, on the basis of the pulse sequence input by an operator of the MRI apparatus 100.

Subsequently, the control signal generating unit 112 calculates operation timing with which the active decoupling circuit 19 is operated, on the basis of the type of the transmission RF pulse and the generation timing of the RF pulses determined by the sequence controlling unit 120. After that, the control signal generating unit 112 generates a control signal every time a time indicated in the calculated operation timing arrives. Further, the control signal generating unit 112 sequentially transfers the generated control signals to the reception coil 109 via each of the wireless communication units 110.

In each of the wireless communication units 110, the modulating unit 44 is configured to append absolute time information to the control signals generated by the control signal generating unit 112, by using the clock signals generated by the clock signal generating unit 5.

The modulation processing unit 46 is configured to generate a control-signal transfer-purpose signal by performing a modulating process on each of the control signals to which the absolute time information was appended by the modulating unit 44, while using the carrier frequency generated by the carrier signal generating unit 45. The modulation processing unit 46 is configured to subsequently amplify the control-signal transfer-purpose signal by using the amplifier 47 and to transmit the amplified control-signal transfer-purpose signal from the wireless antenna 41.

In the reception coil 109, the wireless antenna 11 is configured to receive the control-signal transfer-purpose signal transmitted from the wireless antenna 41. The detecting unit 14 is configured to detect the control signals from the control-signal transfer-purpose signal received by the wireless antenna 11, by using the carrier frequency generated by the carrier signal generating unit 15. Further, the control signal detecting unit 17 is configured to detect the control signals, by using the absolute time information supplied from the coil-specific clock signal generating unit 16. In this situation, in the same manner as the clock signal generating unit 5 does, the coil-specific clock signal generating unit 16 generates a reference clock signal that exhibits amplitude fluctuations repeated at a predetermined frequency.

The controlling unit 18 sequentially sends the control signals detected by the control signal detecting unit 17 to the active decoupling circuit 19. As a result, the active decoupling circuit 19 performs the active decoupling process according to the control signals generated by the control signal generating unit 112.

As explained above, the control signal generating unit 112 generates the control signals on the basis of the image taking condition. After that, the control signal generating unit 112 transmits the generated control signals to the reception coil 109 via the wireless communication. The reception coil 109 receives the control signals via the wireless communication and performs the operations according to the control signals, on the basis of the received control signals. In the example above, the situation is explained in which the control signal generating unit 112 causes the active decoupling process to be performed; however, possible embodiments are not limited to this example. For instance, the active decoupling process does not necessarily have to be performed. Further, the control signal generating unit 112 may exercise control over other operations, for example, so as to turn on and off the processing units such as the preamplifiers 21A and 21B, the digital conversion unit 22, the modulation processing unit 23, and the amplifier 24.

Returning to the description of FIG. 1, the sequence controlling unit 120 is configured to perform an image taking process on the patient P, by driving the gradient power source 104, the transmitting unit 108, and the receiving unit 111, on the basis of sequence information transmitted from the computer 130. In this situation, the sequence information is information that defines a procedure for performing the image taking process. The sequence information defines: the intensity of the electric current to be supplied to the gradient coil 103 and the timing with which the electric current is to be supplied; the strength of the RF pulse to be supplied by the transmitting unit 108 to the WB coil 107 and the timing with which the RF pulse is to be applied; the timing with which the MR signals are to be detected by the receiving unit 111, and the like. For example, the sequence controlling unit 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, when having received the MR data from the receiving unit 111 as a result of the image taking process performed on the patient P by controlling the magnetostatic field magnet 101, the transmitting unit 108, and the receiving unit 111, the sequence controlling unit 120 transfers the received MR data to the computer 130.

The computer 130 is configured to exercise overall control of the MRI apparatus 100. For example, by driving the functional units described above, the computer 130 performs a data acquiring process and an image reconstructing process. The computer 130 includes an interface unit 131, the image reconstructing unit 132, a storage unit 133, an input unit 134, a display unit 135, and a controlling unit 136.

The interface unit 131 is configured to control transmissions and receptions of various types of signals between the computer 130 and the sequence controlling unit 120. For example, the interface unit 131 transmits sequence execution data generated by controlling unit 136 to the sequence controlling unit 120. Further, the interface unit 131 receives MR signal data from the sequence controlling unit 120 and stores the received MR signal data into the storage unit 133 for each patient P.

The image reconstructing unit 132 is configured to generate spectrum data and image data of desired nuclear spins on the inside of the patient P, by applying a post-processing process, i.e., a reconstructing process such as a Fourier transform process on the MR signal data stored in the storage unit 133. Further, the image reconstructing unit 132 stores the generated spectrum data and image data into the storage unit 133.

The storage unit 133 is configured to store therein various types of data, various types of computer programs, and the like that are required by the processes performed by the controlling unit 136 described below. For example, the storage unit 133 stores therein the MR signal data received by the interface unit 131 and the spectrum data and the image data generated by the image reconstructing unit 132, for each patient P. The storage unit 133 is a storage device configured by using, for example, a semiconductor memory element such as a Random Access Memory (RAM), a Read-Only Memory (ROM), a flash memory, or a hard disk, an optical disk, or the like.

The input unit 134 is configured to receive various types of instructions and inputs of information from the operator. The input unit 134 may be configured by using any of the following as necessary: a pointing device such as a mouse or a trackball; a selecting device such as a mode changing switch; and an input device such as a keyboard.

The display unit 135 is configured to display various types of information such as the spectrum data or the image data, under the control of the controlling unit 136. The display unit 135 may be configured by using a display device such as a liquid crystal display device.

The controlling unit 136 includes a Central Processing Unit (CPU), a memory, and the like (not illustrated) and is configured to exercise overall control of the MRI apparatus 100. More specifically, the controlling unit 136 controls a scan by generating the sequence execution data on the basis of the various types of instructions received from the operator via the input unit 134 and transmitting the generated sequence execution data to the sequence controlling unit 120, and also, controls the image reconstructing process that is performed on the basis of the MR signal data transmitted from the sequence controlling unit 120 as a result of the scan.

Further, the controlling unit 136 according to the first embodiment includes a distance calculating unit 136A and a specifying unit 136B. Processes performed by the distance calculating unit 136A and the specifying unit 136B will be explained later.

The exemplary configuration of the MRI apparatus 100 according to the first embodiment has thus been explained. In the MRI apparatus 100 according to the first embodiment configured as described above, the RF coil (e.g., the reception coil 109) that receives the echo signals emitted from a patient is configured to transmit the received echo signals to the main body side of the MRI apparatus 100 via a wireless communication.

In this situation, in the MRI apparatus 100, a plurality of RF coils may be used at the same time in some situations. In those situations, if the RF coils were of a wired type, it would be possible to specify the installation position of each of the RF coils, on the basis of the connection destination ports to which the wired connections are made on the main body side of the MRI apparatus 100, when the RF coils are attached to the patient P. However, if the RF coils are of a wireless type, it is not possible to specify the installation position of each of the RF coils, because no such connections to the ports are made.

To cope with this situation, the MRI apparatus 100 according to the first embodiment performs the following processes for the purpose of specifying the installation positions of the RF coils.

The distance calculating unit 136A is configured to calculate the distance between each of the wireless communication units 110 and the reception coil 109. For example, by being triggered when the couchtop 105A is inserted into the bore, the distance calculating unit 136A causes each of the wireless communication units 110 to transmit and receive a position detecting signal used for detecting the position of the reception coil 109. Each of the wireless communication units 110 transmits the position detecting signal and receives a response signal sent in response to the transmitted position detecting signal from the reception coil 109. After that, the distance calculating unit 136A calculates the distance between each of the wireless communication units 110 and the reception coil 109, on the basis of a received response result (a response time period or an attenuation amount of the position detecting signal).

Figure 3A:
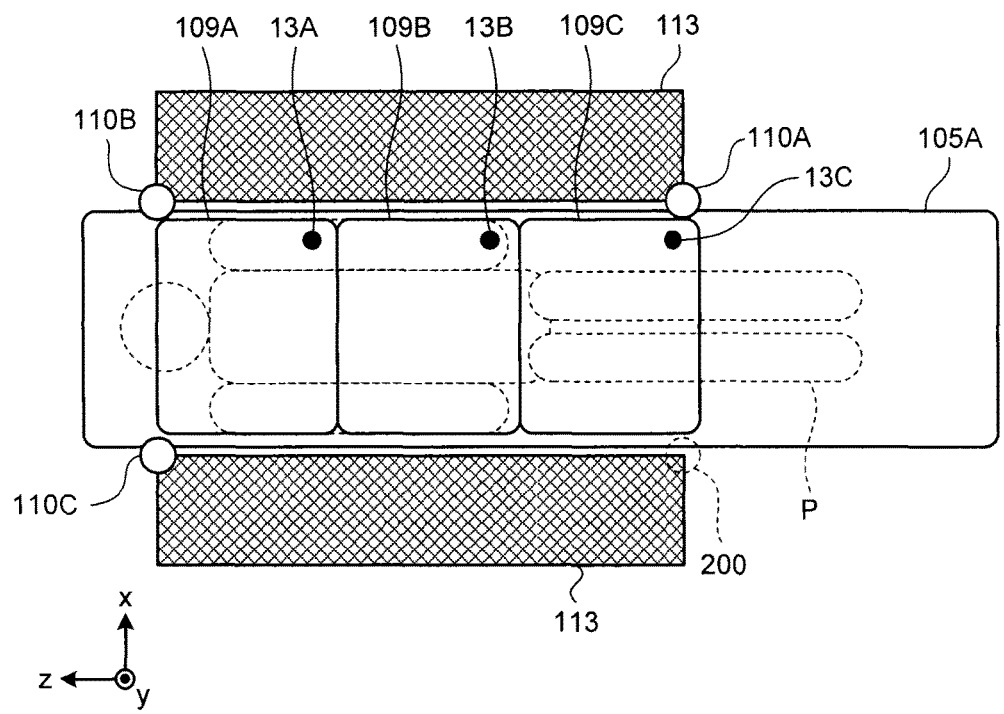
FIG. 3A is a drawing for explaining a process performed by a distance calculating unit according to the first embodiment.
Figure 3B:
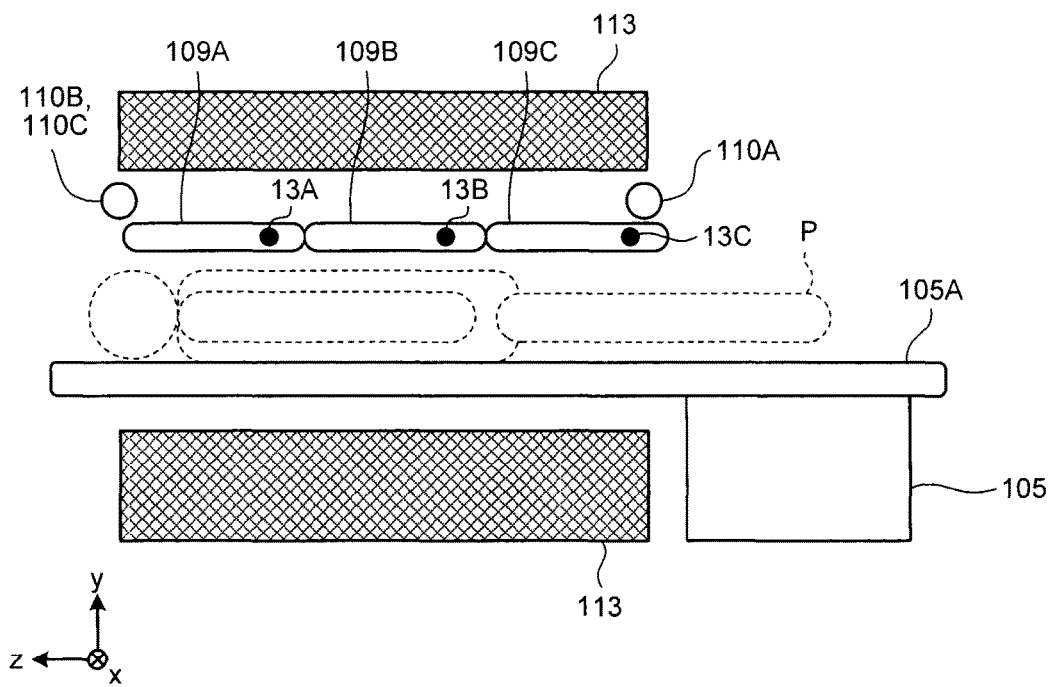
FIG. 3B is another drawing for explaining the process performed by the distance calculating unit according to the first embodiment.

FIGS. 3A and 3B are drawings for explaining a process performed by the distance calculating unit 136A according to the first embodiment. FIG. 3A illustrates a view of the inside of the bore from above, whereas FIG. 3B illustrates a view of the inside of the bore from a side. In this situation, the bore denotes the space on the inside of a gantry 113 into which the couchtop 105A is inserted. In FIGS. 3A and 3B, the regions indicated with hatching are cross sections of the gantry 113. Further, the wireless communication units 110A, 110B, and 110C are disposed at ends of the bore in the axial direction (the z-axis). In the example illustrated in FIGS. 3A and 3B, the wireless communication unit 110A is disposed at such an end of the bore in the axial direction that is positioned on the side where the couch 105 is present (hereinafter, "couch side"), whereas the wireless communication units 110B and 110B are each disposed at such an end of the bore in the axial direction that is positioned on the side where the couch 105 is not present (hereinafter, "non-couch side"). Further, the wireless communication units 110A, 110B, and 110C are installed in positions higher than the positions of the reception coils 109 (FIG. 3B). With this arrangement, it is possible to reduce an impact of communication hindrance caused by the human body on the position detecting signal transmitted from the wireless communication units 110. Consequently, it is possible to accurately specify the installation positions of the reception coils 109.

Further, FIGS. 3A and 3B illustrate the example in which three reception coils, namely reception coils 109A, 109B, and 109C, are connected to the main body of the single MRI apparatus 100 via wireless communications. The wireless antennas 13 included in the reception coils 109A, 109B, and 109C will be referred to as wireless antennas 13A, 13B, and 13C, respectively. Further, the response units 25 included in the reception coils 109A, 109B, and 109C will be referred to as response units 25A, 25B, and 25C, respectively (not illustrated). Further, in the example illustrated in FIGS. 3A and 3B, the orientations of the reception coils 109A, 109B, and 109C when in use are prescribed in advance. Further, for example, each of the reception coils 109A, 109B, and 109C is a Phased Array Coil (PAC).

As illustrated in FIG. 3A, the distance calculating unit 136A sends each of the wireless communication units 110A, 110B, and 110C an instruction to transmit a position detecting signal, by being triggered when, for example, the couchtop 105A is inserted into the bore.

Next, an example will be explained in which the distance between the wireless communication unit 110A and each of the wireless antennas 13 (each of the reception coils 109) is calculated. In the wireless communication unit 110A, when the transmitting and receiving unit 50 has received the instruction to transmit the position detecting signal from the distance calculating unit 136A, the transmitting and receiving unit 50 generates the position detecting signal. The position detecting signal contains transmission origin identification information that identifies the wireless communication unit 110A serving as the transmission origin. After that, the transmitting and receiving unit 50 performs a modulating process on the position detecting signal by using the carrier frequency generated by the carrier signal generating unit 45 and causes the modulated position detecting signal to be transmitted from the wireless antenna 43. Further, on the basis of the reference clock signal supplied from the clock signal generating unit 5, the transmitting and receiving unit 50 calculates the transmission time at which the position detecting signal was transmitted. After that, the transmitting and receiving unit 50 sends the calculated transmission time and the transmission origin identification information that are kept in correspondence with each other, to the distance calculating unit 136A. In the following explanation, the transmission time at which the wireless communication unit 110A transmitted the position detecting signal will be referred to as "T-A", while being kept in correspondence with the transmission origin identification information.

Subsequently, the position detecting signal transmitted from the wireless communication unit 110A is received by each of the wireless antennas 13A, 13B, and 13C included in the reception coils 109A, 109B, and 109C, respectively. More specifically, the position detecting signal is received in the order of proximity to the wireless communication unit 110A serving as the transmission origin, i.e., received by the wireless antennas 13C, 13B, and 13A in the stated order.

Next, an example will be explained in which the reception coil 109A responds to the position detecting signal. In the reception coil 109A, the response unit 25A receives the position detecting signal transmitted from the wireless communication unit 110A via the wireless antenna 13. The response unit 25A demodulates the received position detecting signal by using the carrier frequency generated by the carrier signal generating unit 15. The response unit 25A then reads the transmission origin identification information contained in the position detecting signal and generates a response signal addressed to the wireless communication unit 110A identified by the read transmission origin identification information. The response unit 25A appends response origin identification information identifying the reception coil 109A serving as the response origin, to the generated response signal. After that, the response unit 25A performs a modulating process on the response signal to which the response origin identification information is appended, by using the carrier frequency generated by the carrier signal generating unit 15 and causes the modulated response signal to be transmitted to the wireless communication unit 110A from the wireless antenna 13A. Although the description thereof will be omitted, each of the reception coils 109B and 109C responds to the position detecting signal in the same manner as the reception coil 109A does.

In the wireless communication unit 110A, when having received the response signal transmitted from the reception coil 109A through the wireless antenna 43, the transmitting and receiving unit 50 calculates the reception time at which the response signal was received, on the basis of the reference clock signal supplied from the clock signal generating unit 5. After that, the transmitting and receiving unit 50 sends the calculated reception time, the transmission origin identification information, and the response origin identification information that are kept in correspondence with each other, to the distance calculating unit 136A. Although the description thereof will be omitted, the wireless communication unit 110A calculates a reception time and sends the calculated reception time to the distance calculating unit 136A, for each of the reception coils 109B and 109C, in the same manner as with the reception coil 109A. In the following explanation, the reception time at which the wireless communication unit 110A received the response signal from the reception coil 109A will be referred to as "T-AA", while being kept in correspondence with the transmission origin identification information and the response origin identification information. Further, the reception time at which the wireless communication unit 110A received the response signal from the reception coil 109B will be referred to as "T-AB", while being kept in correspondence with the transmission origin identification information and the response origin identification information. Furthermore, the reception time at which the wireless communication unit 110A received the response signal from the reception coil 109C will be referred to as "T-AC", while being kept in correspondence with the transmission origin identification information and the response origin identification information.

In the manner described above, the wireless communication unit 110A calculates the transmission time "T-A", the reception time "T-AA", the reception time "T-AB", and the reception time "T-AC" by transmitting and receiving the position detecting signal and sends the calculated times to the distance calculating unit 136A.

On the basis of the transmission time "T-A", the reception time "T-AA", the reception time "T-AB", and the reception time "T-AC" received from the wireless communication unit 110A, the distance calculating unit 136A calculates the distance between the wireless communication unit 110A and each of the reception coils 109 (each of the wireless antennas 13).

Next, an example will be explained in which the distance calculating unit 136A calculates the distance (hereinafter, "D-AA") between the wireless communication unit 110A and the wireless antenna 13A (the reception coil 109A). The distance calculating unit 136A calculates the difference between the transmission time "T-A" and the reception time "T-AA". The difference calculated in this situation corresponds to the response time period it took for the reception coil 109A to respond. In this situation, the response time period for the position detecting signal has a value that varies depending on the distance between the wireless communication unit 110A (the wireless antenna 43) and the wireless antenna 13A. Accordingly, the distance calculating unit 136A calculates the distance "D-AA" in accordance with the calculated response time period (the difference). Although the description will be omitted, the distance calculating unit 136A also calculates the distance (hereinafter, "D-AB") between the wireless communication unit 110A and the wireless antenna 13B and the distance (hereinafter, "D-AC") between the wireless communication unit 110A and the wireless antenna 13C, in the same manner as with the distance "D-AA".

As explained above, the distance calculating unit 136A calculates the distance "D-AA", the distance "D-AB", and the distance "D-AC", on the basis of the transmission time "T-A", the reception time "T-AA", the reception time "T-AB", and the reception time "T-AC" received from the wireless communication unit 110A. After that, the distance calculating unit 136A sends the calculated distances to the specifying unit 136B.

Although the description thereof will be omitted, the distance calculating unit 136A calculates the distance between the wireless communication unit 110B and each of the wireless antennas 13A, 13B, and 13C and the distance between the wireless communication unit 110C and each of the wireless antennas 13A, 13B, and 13C, in the same manner as with the process described above. In the following sections, the distance between the wireless communication unit 110B and the wireless antenna 13A will be referred to as "D-BA", the distance between the wireless communication unit 110B and the wireless antenna 13B will be referred to as "D-BB", and the distance between the wireless communication unit 110B and the wireless antenna 13C will be referred to as "D-BC". Further, the distance between the wireless communication unit 110C and the wireless antenna 13A will be referred to as "D-CA", the distance between the wireless communication unit 110C and the wireless antenna 13B will be referred to as "D-CB", and the distance between the wireless communication unit 110C and the wireless antenna 13C will be referred to as "D-CC".

FIGS. 3A and 3B merely illustrate an example. The positions of the wireless communication units 110A, 110B, and 110C, for example, are not limited to the positions illustrated in the drawings. For example, the positions of the wireless communication units 110A, 110B, and 110C are interchangeable. Further, one of the wireless communication units 110A, 110B, and 110C may be disposed in the position indicated as a region 200. Further, the wireless communication units 110 do not necessarily have to be disposed at ends of the bore in the axial direction. It is sufficient if the wireless antennas 43 are disposed at ends of the bore in the axial direction.

In the example illustrated in FIGS. 3A and 3B, the three PACs are used as the reception coils 109; however, possible embodiments are not limited to this example. For instance, the reception coils 109 may include reception coils 109 having various shapes, so that the reception coils 109 can be attached to various image taking sites.

Further, in the example illustrated in FIG. 3B, the wireless communication units 110 are installed in the positions higher than the positions of the reception coils 109; however, possible embodiments are not limited to this example. For instance, the wireless communication units 110 may be installed in positions lower than the positions of the reception coils 109.

The specifying unit 136B is configured to specify the positions of the reception coils 109 on the basis of the response result indicated by the response from each of the reception coils 109. For example, the specifying unit 136B receives the distances "D-AA", "D-AB", "D-AC", "D-BA", "D-BB", "D-BC", "D-CA", "D-CB", and "D-CC" calculated by the distance calculating unit 136A. After that, by using the received distances, the specifying unit 136B specifies the positions (the coordinates) of the wireless antennas 13, as the positions of the reception coils 109.

First, the specifying unit 136B specifies the positions of the wireless antennas 13 (see FIG. 3A) by using the distances calculated by the distance calculating unit 136A. For example, the specifying unit 136B has stored therein, in advance, the positions (three-dimensional positions) of the wireless communication units 110A, 110B, and 110C within the space on the inside of the bore. Subsequently, as the position of the wireless antenna 13A, the specifying unit 136B specifies the position of a point at which the following three planes intersect one another: a plane positioned at the distance "D-AA" from the position of the wireless communication unit 110A; a plane positioned at the distance "D-BA" from the position of the wireless communication unit 110B; and a plane positioned at the distance "D-CA" from the position of the wireless communication unit 110C. Further, as the position of the wireless antenna 13B, the specifying unit 136B specifies the position of a point at which the following three planes intersect one another: a plane positioned at the distance "D-AB" from the position of the wireless communication unit 110A; a plane positioned at the distance "D-BB" from the position of the wireless communication unit 110B; and a plane positioned at the distance "D-CB" from the position of the wireless communication unit 110C. Also, as the position of the wireless antenna 13C, the specifying unit 136B specifies the position of a point at which the following three planes intersect one another: a plane positioned at the distance "D-AC" from the position of the wireless communication unit 110A; a plane positioned at the distance "D-BC" from the position of the wireless communication unit 110B; and a plane positioned at the distance "D-CC" from the position of the wireless communication unit 110C.

Subsequently, by using the specified positions of the wireless antennas 13, the specifying unit 136B specifies the positions and the orientations of coil elements 20 of the reception coils 109. Next, a process performed by the specifying unit 136B to specify the positions and the orientations of the coil elements 20 will be explained.

Figure 4:
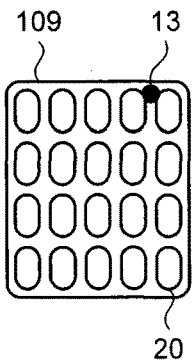
FIG. 4 is a drawing for explaining a process performed by a specifying unit according to the first embodiment.

FIG. 4 is a drawing for explaining the process performed by the specifying unit 136B according to the first embodiment. FIG. 4 illustrates a positional relationship between the wireless antenna 13 and the coil elements 20 on the inside of one of the reception coils 109. Further, the reception coil 109 illustrated in FIG. 4 is configured with a PAC, and the orientation of the reception coil 109 when in use is prescribed in advance.

As illustrated in FIG. 4, each of the reception coils 109 includes a predetermined number of coil elements 20 disposed in prescribed positions that are prescribed in advance with respect to the wireless antenna 13. In the example illustrated in FIG. 4, the reception coil 109 includes twenty coil elements 20. Each of the twenty coil elements 20 is disposed in the prescribed position that is prescribed in advance with respect to the wireless antenna 13. The prescribed positions are stored in the specifying unit 136B.

For example, on the basis of the position of the wireless antenna 13, the orientation of the reception coil 109, and the prescribed positions of the coil elements prescribed, the specifying unit 136B specifies the position and the orientation of each of the coil elements. In the example illustrated in FIG. 4, the orientation of the reception coil 109 is prescribed in advance. Accordingly, by using, for example, the position of the wireless antenna 13A, the orientation of the reception coil 109A, and the prescribed position of each of the twenty coil elements specified, the specifying unit 136B specifies the position and the orientation of each of the coil elements included in the reception coil 109A. Further, in the same manner as with the reception coil 109A, the specifying unit 136B specifies the position and the orientation of each of the coil elements included in the reception coil 109B, as well as the position and the orientation of the each of the coil elements included in the reception coil 109C.

As explained above, on the basis of the response result indicated by the response from each of the reception coils 109, the specifying unit 136B specifies the positions of the reception coils 109. After that, by using the specified position of each of the wireless antennas 13, the specifying unit 136B specifies the positions and the orientations of the coil elements 20 included in the reception coil 109.

In other words, when the orientation of each of the reception coils 109 is prescribed in advance, the specifying unit 136B specifies the position and the orientation of the reception coil 109, on the basis of the orientation of the reception coil 109 prescribed in advance and the response result. More specifically, even if the number of wireless antennas 13 installed in the reception coil 109 is only one, the specifying unit 136B specifies the position and the orientation of the reception coil 109 by combining together information about the prescribed orientation and the response result, as long as the orientation of the reception coil 109 when in use is prescribed in advance. The information about the orientation is, for example, prescribed in advance for each of different types of reception coils 109 and is stored in a storage device such as the storage unit 133. For this reason, the specifying unit 136B is able to obtain the information about the orientation of each of the reception coils 109, by receiving the response origin identification information described above from the reception coil 109.

Figure 5:
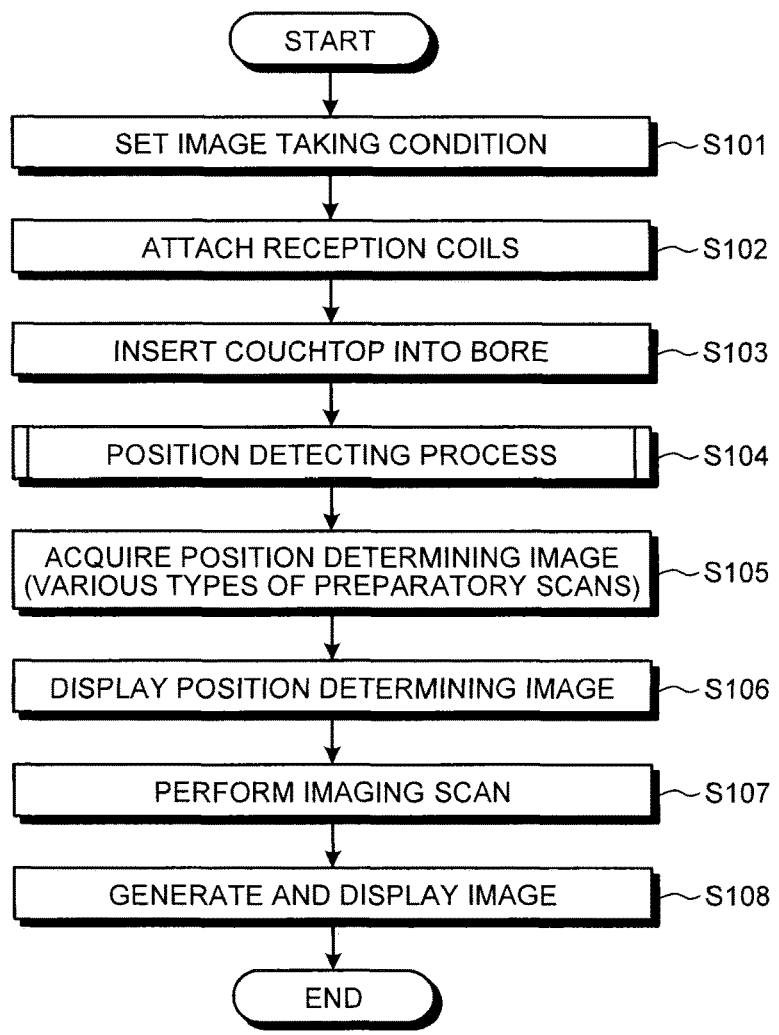
FIG. 5 is a flowchart of an overall processing procedure according to the first embodiment.

FIG. 5 is a flowchart of an overall processing procedure according to the first embodiment. As illustrated in FIG. 5, first, the controlling unit 136 receives an input of an image taking condition from the operator through a Graphical User Interface (GUI) via the input unit 134 and generates sequence information according to the received image taking condition (step S101).

After that, the reception coils 109 are attached to the patient P, and the patient P is placed on the couchtop 105A of the couch 105 (step S102). For example, the reception coils 109 are each a PAC having a plurality of coil elements.

Subsequently, the couch controlling unit 106 moves the couch 105 (step S103). More specifically, when the couch controlling unit 106 has moved the couchtop 105A to a predetermined position, light from a projector (not illustrated) is radiated onto the patient P. At the time when the light from the projector is radiated onto an image taking site, the operator inputs a designation of the position of the image taking site via the input unit 134. Accordingly, the couch controlling unit 106 moves the couchtop 105A in such a manner that the designated image taking site is positioned at the center of the magnetic field.

After that, the controlling unit 136 performs a position detecting process, by being triggered when the couchtop 105A is inserted into the bore (step S104). Next, the position detecting process will be explained, with reference to FIG. 6.

Figure 6:
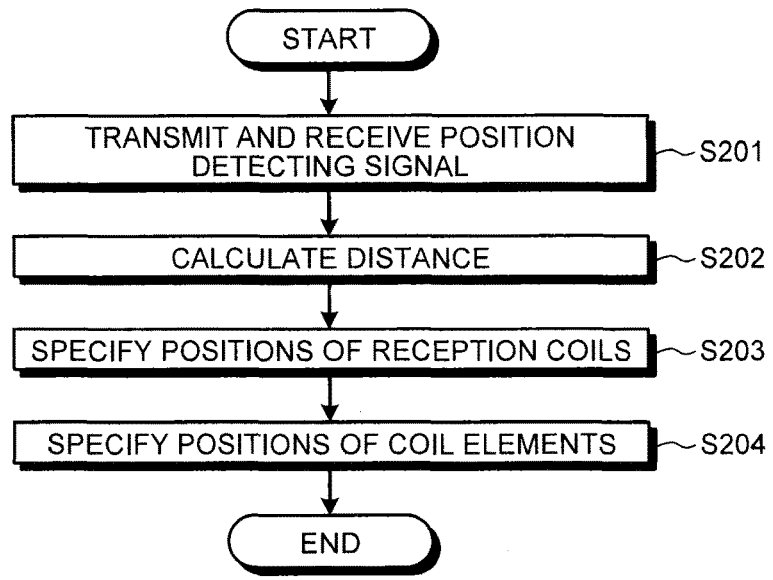
FIG. 6 is a drawing for explaining a position detecting process according to the first embodiment.

FIG. 6 is a drawing for explaining the position detecting process according to the first embodiment. As illustrated in FIG. 6, in the controlling unit 136, the distance calculating unit 136A causes the wireless communication units 110 to transmit and receive a position detecting signal (step S201). Accordingly, the wireless communication unit 110 calculates the transmission time at which the position detecting signal was transmitted by the wireless communication unit 110 and the reception times at which response signals were received from the reception coils 109 in response to the position detecting signal.

On the basis of the transmission time and the reception times calculated by the wireless communication unit 110, the distance calculating unit 136A calculates the distance between the wireless communication unit 110A and each of the wireless antennas 13 (step S202). For example, the distance calculating unit 136A calculates the difference (the response time period) between the transmission time and each of the reception times. After that, the distance calculating unit 136A calculates the distance between each of the wireless communication units 110 and each of the reception coils 109 in accordance with the calculated response time periods.

On the basis of the response result (the response time period) indicated by the response from each of the reception coils 109, the specifying unit 136B specifies the position of each of the reception coils 109 (step S203). For example, the specifying unit 136B receives the distances between each of the wireless communication units 110 and each of the wireless antennas 13 calculated by the distance calculating unit 136A. Subsequently, by using the received distances and the positions of the wireless communication units 110, the specifying unit 136B specifies the position of the wireless antenna 13 included in each of the reception coils 109 as the position of the reception coil 109.

After that, by using the specified position of each of the wireless antennas 13, the specifying unit 136B specifies the positions and the orientations of the coil elements 20 included in each of the reception coils 109 (step S204). For example, the specifying unit 136B specifies the positions and the orientations of the coil elements, on the basis of the specified positions of the wireless antennas 13, the orientations of the reception coils 109, and the prescribed positions of the coil elements.

Returning to the description of FIG. 5, the sequence controlling unit 120 is configured to perform various types of preparatory scans, for example, to acquire a position determining image, to take a sensitivity map image, and to take a shimming image (step S105). After that, when the acquired position determining image is displayed on the display unit 135, the controlling unit 136 causes the positions and the orientations of the coil elements specified as a result of the position detecting process to be displayed over the position determining image (step S106). For example, the controlling unit 136 causes the positions and the orientations of the coil elements 20 included in each of the reception coils 109 attached to the patient P to be displayed over the position determining image taken of the patient P. In this situation, for example, the controlling unit 136 receives an instruction from the operator designating one or more coil elements 20 to be used in an image taking process.

Subsequently, after setting the coil elements 20 designated by the operator, the sequence controlling unit 120 performs an imaging scan (step S107). After that, the image reconstructing unit 132 generates an image from the MR data acquired by the sequence controlling unit 120, so that the display unit 135 displays the generated image (step S108).

Possible overall processing procedures according to the first embodiment are not necessarily limited to the processing procedure illustrated in FIGS. 5 and 6. For instance, FIG. 5 illustrates the example in which the position detecting process at step S104 is performed by being triggered when the couchtop 105A is inserted into the bore; however, possible embodiments are not limited to this example. For instance, the position detecting process may be performed by being triggered when an input of a start instruction is received from the operator.

Further, for example, the process at step S204 does not necessarily have to be performed. In that situation, for example, the controlling unit 136 is able to aid the operator by causing the positions of the reception coils 109 specified by the specifying unit 136B to be displayed over the position determining image. For example, the operator is thus able to easily perform the operation of selecting one or more of the reception coils 109 to be used.

As explained above, in the MRI apparatus 100 according to the first embodiment, each of the wireless communication units 110 includes the wireless antenna 43 at an end of the bore in the axial direction, so that the position detecting signal is transmitted from the wireless antenna 43. Further, each of the reception coils 109 includes the wireless antenna 13, so as to receive the position detecting signal and to respond to the received position detecting signal through the wireless antenna 13. The specifying unit 136B specifies the positions of the reception coils 109 on the basis of the response results indicated by the responses from the reception coils 109. Thus, the MRI apparatus 100 is able to specify the installation positions of the reception coils 109.

Further, for example, the MRI apparatus 100 according to the first embodiment specifies the positions and the orientations of the coil elements 20 included in each of the reception coils 109. Thus, for example, by causing the specified positions and orientations of the coil elements 20 to be displayed over the position determining image, the MRI apparatus 100 is able to aid the operator. For example, the operator only needs to select one or more of the coil elements 20 displayed over the position determining image. Thus, the operator is able to easily select the coil elements to be used.

In the first embodiment, the example is explained in which the distance calculating unit 136A calculates the distance between each of the wireless communication units 110 and each of the wireless antennas 13, by using the response time periods of the position detecting signal; however, possible embodiments are not limited to this example. For instance, the distance calculating unit 136A may calculate the distance between each of the wireless communication units 110 and each of the wireless antennas 13, by using attenuation amounts of the position detecting signal.

In that situation, for example, the transmitting and receiving unit 50 causes a position detecting signal that always has a constant intensity to be transmitted from the wireless antenna 43. Further, the response unit 25 transmits a response signal having the same intensity as that of the received position detecting signal, to the wireless communication unit 110. After that, the transmitting and receiving unit 50 measures the intensity of the response signal received from the response unit 25 and calculates the difference (an attenuation amount) between the measured intensity and the intensity of the transmitted position detecting signal. In accordance with the attenuation amount calculated by the transmitting and receiving unit 50, the distance calculating unit 136A calculates the distance. However, possible embodiments are not limited to this example. For instance, the response unit 25 may cause a response signal that always has a constant intensity to be transmitted from the wireless antenna 13. In that situation, the transmitting and receiving unit 50 calculates the distance in accordance with an attenuation amount of the response signal transmitted from the response unit 25.

Further, in the first embodiment, the example is explained in which the positions of the three reception coils 109 are specified; however, possible embodiments are not limited to this example. The MRI apparatus 100 is capable of specifying positions of any arbitrary number of reception coils 109.

Further, in the example illustrated in FIG. 2, the three wireless communication units 110A, 110B, and 110C have mutually the same configuration; however, the three wireless communication units 110 do not necessarily have to have mutually the same configuration. For example, if the wireless communication unit 110A includes the wireless antennas 41, 42, and 43, the modulating unit 44, the carrier signal generating unit 45, the modulation processing unit 46, the amplifier 47, the demodulation processing unit 48, the analog conversion unit 49, and the transmitting and receiving unit 50, it is sufficient if each of the wireless communication units 110B and 110C includes the wireless antenna 43, the carrier signal generating unit 45, and the transmitting and receiving unit 50. In other words, it is sufficient if at least one of the wireless communication units 110 includes the wireless antennas 41 and 42, the modulating unit 44, the modulation processing unit 46, the amplifier 47, the demodulation processing unit 48, and the analog conversion unit 49, which form the configuration that is used only for the transfer of the control signals or the transfer of the MR signals. Further, another wireless communication unit 110 that transfers the control signals and transfers the MR signals may be provided separately from the wireless communication units 110A, 110B, and 110C illustrated in the drawings.

Further, the wireless antennas 41, 42, and 43 illustrated in FIG. 2 may be designed for common use. In other words, the wireless antennas 41, 42, and 43 may be replaced by a single wireless antenna. That is to say, the wireless antenna 43 may be used for at least one selected from the transmission of the control signals and the reception of the echo signals. Further, the wireless antennas 11, 12, and 13 may be designed for common use. In other words, the wireless antennas 11, 12, and 13 may be replaced by a single wireless antenna. That is to say, the wireless antenna 13 may be used for at least one selected from the reception of the control signals and the transmission of the echo signals. In other words, the wireless antenna 13 included in each of the reception coils 109 may further perform at least one selected from the reception of the control signals and the transmission of the echo signals, in addition to the receiving of and the responding to the wireless signals.

Further, although not explained in FIG. 4, each of the reception coils 109 includes the wireless antenna 13 in a predetermined position of an exterior part (the casing) of the reception coil 109. In other words, the positional relationship between the wireless antenna 13 and the exterior part of each of the reception coils 109 is prescribed in advance. Thus, the specifying unit 136B may specify the position of the exterior part of each of the reception coils 109, by using the specified position of the wireless antenna 13 and the positional relationship between the wireless antenna 13 and the exterior part of the reception coil 109. With this arrangement, for example, the controlling unit 136 is able to cause not only the positions of the coil elements 20, but also the position of the exterior part of each of the reception coils 109 to be displayed over the position determining image.

A Modification Example of the First Embodiment

Further, in the first embodiment, the example is explained in which such a PAC is used that the orientation of the reception coil 109 when in use is prescribed in advance; however, the embodiments of the present disclosure are also applicable to a situation where the orientation of the reception coil 109 is not prescribed.

Figure 7:
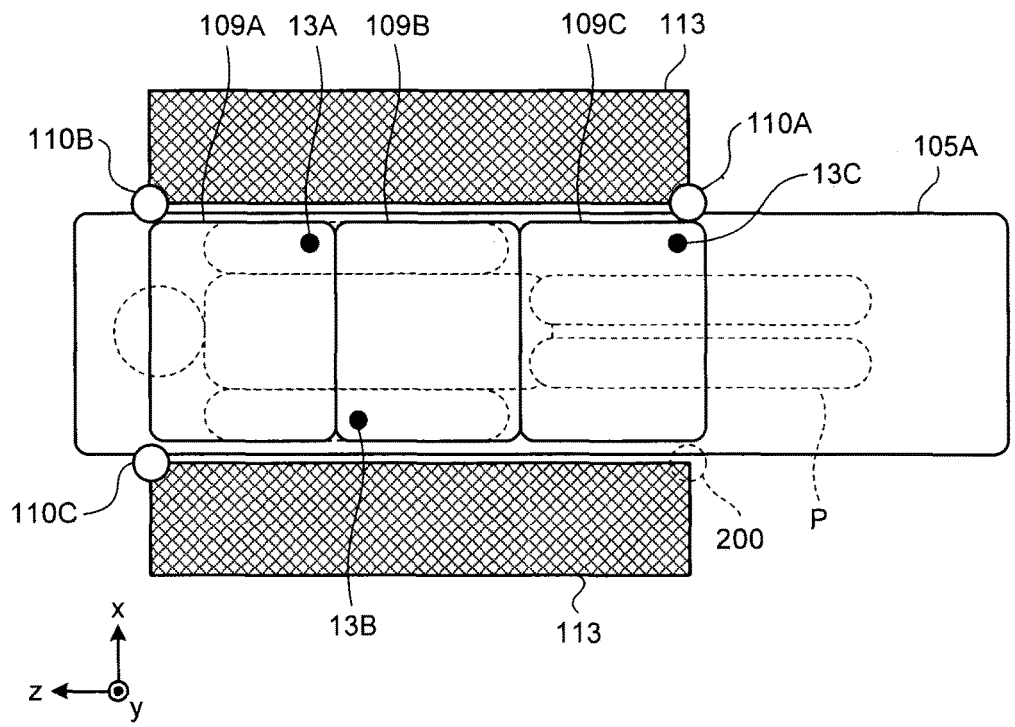
FIG. 7 is a drawing for explaining a process according to a modification example of the first embodiment.

FIG. 7 is a drawing for explaining a process according to a modification example of the first embodiment. FIG. 7 illustrates a view of the inside of the bore from above. In FIG. 7, the reception coil 109B is disposed so as to be oriented with a 180-degree rotation from the orientation illustrated in FIG. 3A. Thus, the orientations of the reception coils 109 are not prescribed. It should be noted, however, that the front and the back of the reception coils 109 are prescribed in advance, also in FIG. 7.

In this situation, the distance calculating unit 136A calculates the distance between each of the wireless communication units 110 and each of the wireless antennas 13 by performing the same process as described above. After that, the specifying unit 136B specifies the positions of the wireless antennas 13A, 13B, and 13C by performing the same process as described above. Subsequently, the specifying unit 136B specifies the order in which the reception coils 109A, 109B, and 109C are arranged in the axial direction, on the basis of the positions of the wireless antennas 13A, 13B, and 13C.

By displaying in this manner the specified order in which the reception coils 109A, 109B, and 109C are arranged in the axial direction, the MRI apparatus 100 is able to aid the operator.

In other words, the reception coils 109 include the plurality of wireless antennas 13. Further, the specifying unit 136B specifies the positions of the plurality of wireless antennas 13 included in the reception coils 109 and specifies the positions and the orientations of the reception coils 109 on the basis of the specified positions of the wireless antennas 13. Thus, even if the orientations of the reception coils 109 are not prescribed, the MRI apparatus 100 is able to specify the installation positions of the reception coils 109.

Second Embodiment

In the first embodiment described above, the example is explained in which each of the reception coils 109 includes the single wireless antenna 13; however, possible embodiments are not limited to this example. For instance, each of the reception coils 109 may include two or more wireless antennas 13. Thus, in a second embodiment, an example will be explained in which a reception coil 109 includes two or more wireless antennas 13.

Figure 8:
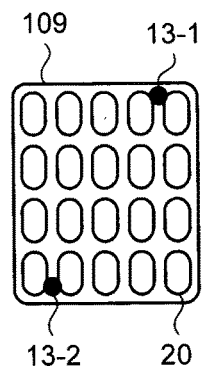
FIG. 8 is a drawing for explaining a configuration of a reception coil according to a second embodiment.

FIG. 8 is a drawing for explaining a configuration of the reception coil 109 according to the second embodiment. FIG. 8 illustrates a positional relationship between wireless antennas 13-1, 13-2 and the coil elements 20 on the inside of the reception coil 109. In this situation, the positional relationship between the wireless antenna 13-1 and the wireless antenna 13-2 on the inside of the reception coil 109 is prescribed in advance. Further, the positional relationships between each of the wireless antennas 13-1 and 13-2 and the exterior part of the reception coil 109 are prescribed in advance.

As illustrated in FIG. 8, the reception coil 109 includes the wireless antennas 13-1 and 13-2. Each of the wireless antennas 13-1 and 13-2 has assigned thereto identification information that identifies the wireless antenna (13-1, 13-2).

For example, the distance calculating unit 136A calculates the distances between each of the wireless antennas 13-1 and 13-2 and each of the wireless communication units 110 by transmitting and receiving a position detecting signal while using the identification information assigned to each of the wireless antennas 13-1 and 13-2.

Further, the specifying unit 136B specifies the position of each of the wireless antennas 13-1 and 13-2, by using the distances between each of the wireless antennas 13-1 and 13-2 and each of the wireless communication units 110 calculated by the distance calculating unit 136A. After that, the specifying unit 136B specifies the position and the orientation of the exterior part of the reception coil 109, by using the specified positions of the wireless antennas 13-1 and 13-2 and the positional relationships between each of the wireless antennas 13-1, 13-2 and the exterior part of the reception coil 109.

Further, the specifying unit 136B estimates warping of the reception coil 109, which is flexible, on the basis of the specified positions of the wireless antennas 13 and the positional relationship among the wireless antennas 13.

Figure 9:
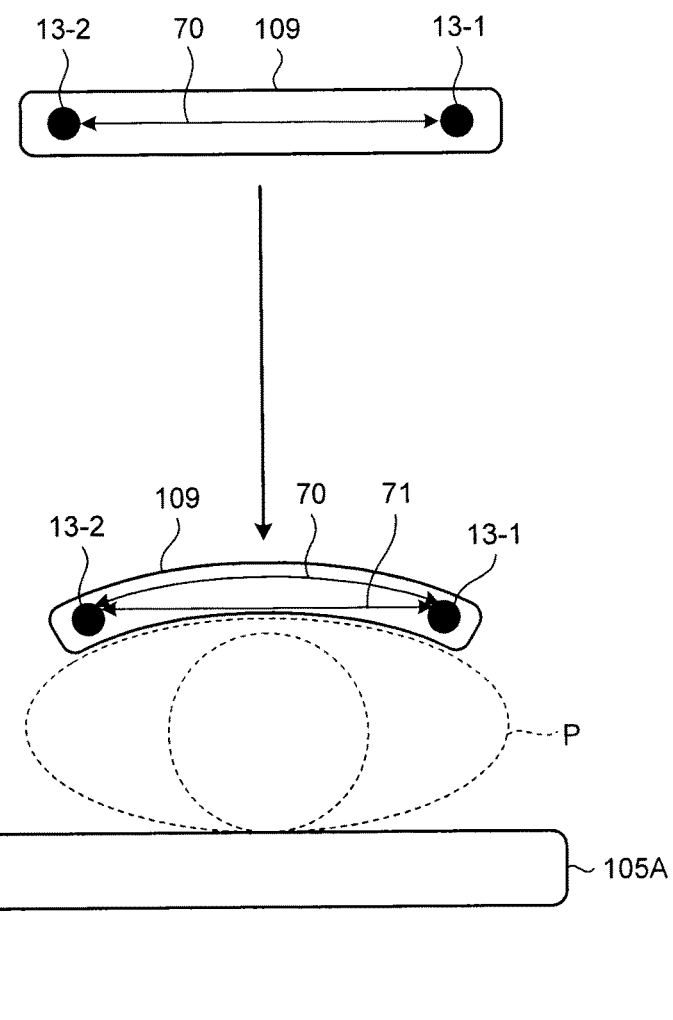
FIG. 9 is a drawing for explaining a process performed by the specifying unit to estimate warping according to the second embodiment.

FIG. 9 is a drawing for explaining the process performed by the specifying unit 136B to estimate the warping according to the second embodiment. The top part of FIG. 9 illustrates the reception coil 109 that is not warped and is viewed in the axial direction. The bottom part of FIG. 9 illustrates the reception coil 109 that is warped due to being attached to the patient P and is viewed in the axial direction.

As illustrated in the top part of FIG. 9, in the reception coil 109 that is not warped, a distance 70 in the x-axis direction between the wireless antenna 13-1 and the wireless antenna 13-2 is prescribed in advance. In contrast, as illustrated in the bottom part of FIG. 9, when the reception coil 109 is warped due to being attached to the patient P, the line defining the distance 70 forms an arc along the shape of the patient P. Accordingly, by calculating a linear distance 71 in the x-axis direction between the wireless antenna 13-1 and the wireless antenna 13-2, it is possible to estimate the shape of the arc formed by the line that defined the distance 70, i.e., the warping of the reception coil 109.

In this situation, the specifying unit 136B calculates the linear distance 71 from the specified position (the coordinates) of each of the wireless antennas 13-1 and 13-2. After that, the specifying unit 136B estimates the shape of the arc, by arranging the length of the arc that passes the two ends of the calculated linear distance 71 to be equal to the distance 70. In this situation, the estimated shape of the arc corresponds to the warping of the reception coil 109.

The specifying unit 136B estimates the warping of the reception coil 109 in this manner. With this arrangement, the MRI apparatus 100 is able to specify the positions and the orientations of the coil elements 20 more accurately. For example, the MRI apparatus 100 is able to cause the positions and the orientations of the coil elements 20 to be displayed more accurately, by causing the estimated warping of the reception coil 109 to be reflected in the positions and the orientations of the coil elements 20 displayed over the position determining image. In one example, as illustrated in the bottom part of FIG. 9, the MRI apparatus 100 generates image data rendering an axial-direction view of the reception coil 109 that is warped due to being attached to the patient P and causes the display unit 135 to display the generated image data.

In the second embodiment, the example is explained in which the exterior part of the reception coil 109 is warped in the entirety thereof; however, possible embodiments are not limited to this example. For instance, the exterior part of the reception coil 109 may be provided with a hard case. The hard case corresponds to a part where the substrate of the controlling unit 18 and the like illustrated in FIG. 2 is installed and has such a level of firmness that the hard case does not get warped. For this reason, the specifying unit 136B estimates warping of the reception coil 109 while taking into account that the part corresponding to the hard case does not get warped. More specifically, the specifying unit 136B may perform the estimating process, with a definition that the part of the reception coil 109 corresponding to the hard case remains as a straight line without any change and that only the part other than the hard case is warped into an arc shape.

Further, in the second embodiment, the example is explained in which the reception coil 109 includes the two wireless antennas 13; however, possible embodiments are not limited to this example. For instance, the reception coil 109 may include three or more wireless antennas 13.

Further, the plurality of wireless antennas 13 included in the reception coil 109 are disposed in the mutually-different positions. With the arrangement in which the plurality of wireless antennas 13 are arranged in the mutually-different positions on the inside of the reception coil 109 in this manner, the specifying unit 136B is able to specify the orientation of the reception coil 109. Further, it is desirable to arrange the plurality of wireless antennas 13 to be positioned away from one another, to make it possible to specify the orientation of the reception coil 109 more accurately and to estimate the warping of the reception coil 109 more accurately. In other words, it is desirable to arrange the plurality of wireless antennas 13 in dispersed positions on the inside of the reception coil 109 in such a manner that the coil elements 20 are interposed therebetween.

Although it is possible to specify the orientation of the reception coil 109 in the second embodiment, it is also possible to estimate the warping of the reception coil 109 even if the orientation of the reception coil 109 is not necessarily specified. In other words, the wireless communication unit 110 includes the wireless antenna 43 and is configured to transmit and receive the wireless signal through the wireless antenna 43. The reception coil 109 includes the plurality of wireless antennas 13 and is configured to receive the wireless signal and to respond to the received wireless signal through each of the wireless antennas 13. The specifying unit 136B is configured to specify the positions of the plurality of wireless antennas 13 on the basis of the response results indicated by the responses from the plurality of wireless antennas 13 and is further configured to estimate the warping of the reception coil 109, on the basis of the specified positions of the wireless antennas 13 and the positional relationship among the wireless antennas 13.

Third Embodiment

The first and the second embodiments have thus been explained. The present disclosure can be carried out in various forms other than those described in these embodiments.

Regarding the Number of Wireless Communication Units 110

In the embodiments above, the example is explained in which the three wireless communication units 110 are used; however, possible embodiments are not limited to this example. For instance, the MRI apparatus 100 may specify the positions of the reception coils 109 by using two of the wireless communication units 110. In that situation, the MRI apparatus 100 specifies the positions in a direction that uses a line connecting the two wireless communication units 110 together as an axis. For this reason, it is desirable to configure the MRI apparatus 100 in such a manner that the two wireless communication units 110 are provided on the two ends (on the couch side and the non-couch side) of the bore in the axial direction.

The Position of the Wireless Antenna 43

In the embodiments described above, the example is explained in which the wireless antenna 43 included in each of the wireless communication units 110 is disposed at an end of the bore in the axial direction; however, possible embodiments are not limited to this example. For instance, the wireless antenna 43 may be disposed in any arbitrary position on the inside of the bore or may be disposed on the outside of the bore as a device independent of the gantry 113. It should be noted, however, that it is desirable to dispose the wireless antenna 43 in such a position that the signals (the position detecting signal and the response signal) exchanged between the wireless antenna 43 and the reception coil 109 are not blocked by other objects (e.g., the gantry 113, the patient, and the like). In other words, the wireless communication unit 110 includes the wireless antenna 43 and is configured to transmit and receive the wireless signal through the wireless antenna 43.

Using a Signal Profile

Further, for example, the MRI apparatus 100 may specify the positions of the reception coils 109 by further using a signal profile.

Figure 10:
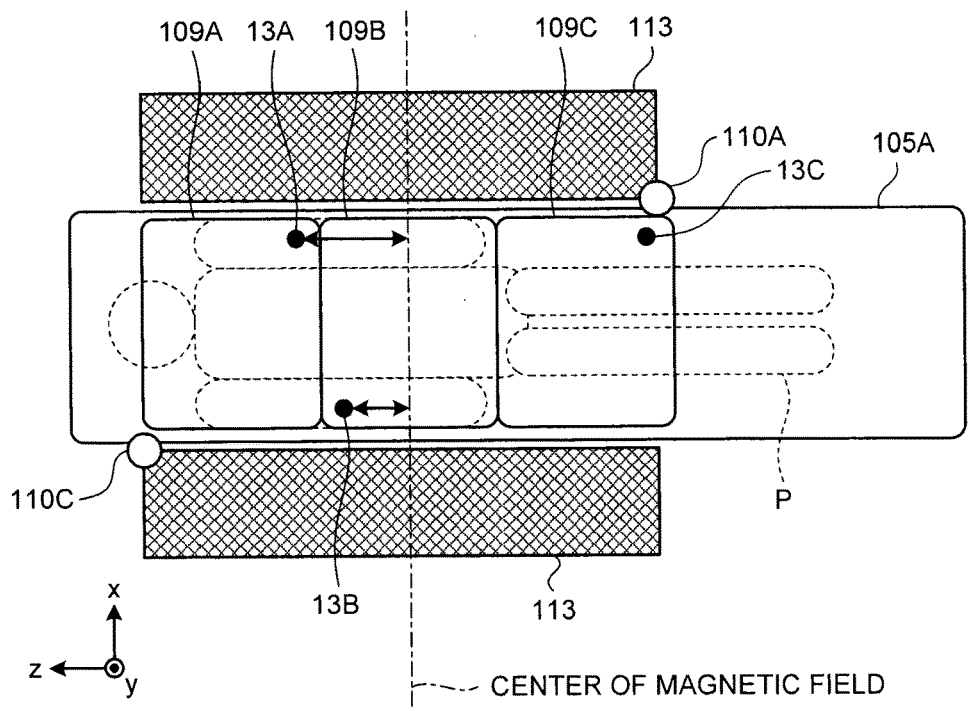
FIG. 10 is a drawing for explaining a process performed by the specifying unit according to a third embodiment.

FIG. 10 is a drawing for explaining a process performed by the specifying unit 136B according to a third embodiment. FIG. 10 illustrates a view of the inside of the bore from above. In the example illustrated in FIG. 10, the MRI apparatus 100 includes the two wireless communication units 110A and 110C and does not include the wireless communication unit 110B unlike the example illustrated in FIG. 7.

In this situation, it is difficult for the specifying unit 136B to specify the positions of the reception coils 109A and 109B. The reason is that the distance between the wireless communication unit 110A and each of the wireless antennas 13A and 13B is short, and also, the distance between the wireless communication unit 110C and each of the wireless antennas 13A and 13B is short. In other words, there is a possibility that the specifying unit 136B may specify the positions of the wireless antennas 13A and 13B in the order opposite to the order illustrated in FIG. 10.

In this situation, the specifying unit 136B obtains a signal profile of each of the reception coils 109. According to the signal profiles, the shorter the distance from the center of the magnetic field to an RF coil is, the higher the signal intensity is. Conversely, the longer the distance from the center of the magnetic field to an RF coil is, the lower the signal intensity is. Thus, the specifying unit 136B refers to the obtained signal profiles and compares the signal intensities of the reception coils 109A and 109B with each other. In the example illustrated in FIG. 10, because the signal intensity of the reception coil 109B is higher than that of the reception coil 109A, the specifying unit 136B determines that the reception coil 109B is positioned closer to the center of the magnetic field than the reception coil 109A is. Accordingly, the specifying unit 136B is able to specify the positions of the reception coils 109A and 109B. In other words, the specifying unit 136B is able to reduce the number of wireless communication units 110 to be employed, by using the signal profiles.

A Linear Coil

In the embodiments described above, the example is explained in which a PAC is used as each of the reception coils 109; however, it is acceptable to use any other type of RF coil. For example, the MRI apparatus 100 may use a linear coil as an RF coil having a higher level of freedom in terms of the installation position and the orientation thereof when in use. The linear coil is an RF coil which includes one coil element and of which most of the exterior part of the coil element is formed by using a flexible material. Such a linear coil may be called a "one-loop coil" or a "flexible coil".

Figure 11:
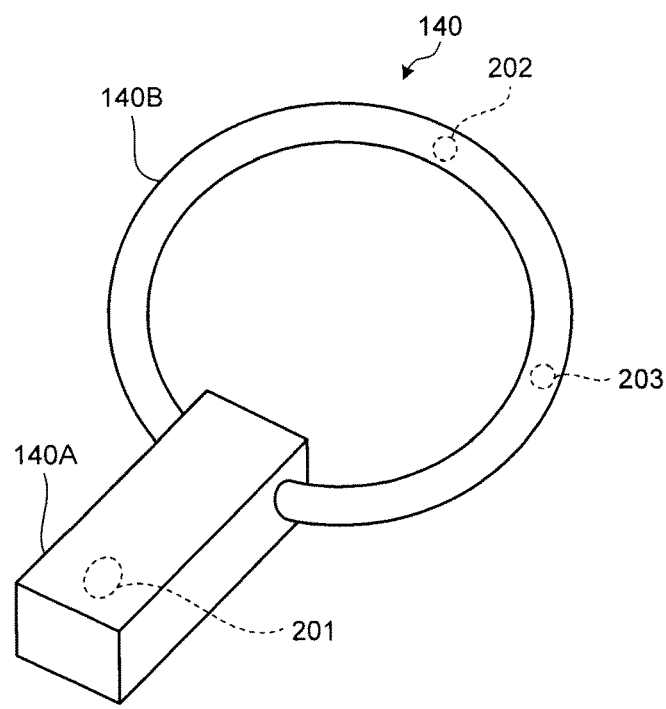
FIG. 11 is a drawing for explaining a linear coil according to the third embodiment.

FIG. 11 is a drawing for explaining a linear coil according to the third embodiment. FIG. 11 is a perspective view of a linear coil 140. As illustrated in FIG. 11, the linear coil 140 includes a hard case 140A and a loop 140B. The hard case 140A corresponds to a part where the substrate of the controlling unit 18 and the like is installed and has no flexibility. The loop 140B is shaped so that one coil element 20 is covered by an exterior cover that is flexible.

In this situation, for example, the linear coil 140 may include one wireless antenna 13. In that situation, the linear coil 140 includes the wireless antenna 13 in a position illustrated as a region 201 on the inside of the hard case 140A. For this reason, by performing the process described above, the MRI apparatus 100 is able to approximately specify the position of the linear coil 140, by specifying the position of the wireless antenna 13.

Alternatively, for example, the linear coil 140 may include two wireless antennas 13. In that situation, the linear coil 140 includes the wireless antennas 13 in the position illustrated as the region 201 on the inside of the hard case 140A and in a position illustrated as a region 202 on the inside of the loop 140B. Thus, by performing the process described above, the MRI apparatus 100 is able to specify the positions of the two wireless antennas 13. Accordingly, the MRI apparatus 100 is able to specify the position and the orientation of the linear coil 140 and to estimate warping of the linear coil 140.

In yet another example, the linear coil 140 may include three wireless antennas 13. In that situation, the linear coil 140 includes the wireless antennas 13 in the position illustrated as the region 201 on the inside of the hard case 140A and in the positions illustrated as the region 202 and a region 203 on the inside of the loop 140B. Thus, by performing the process described above, the MRI apparatus 100 is able to specify the positions of the three wireless antennas 13. Further, the MRI apparatus 100 is able to specify the position and the orientation of the linear coil 140 more accurately and to estimate warping of the linear coil 140 more accurately.

As explained above, the embodiments of the present disclosure are applicable to the reception coil 109 of which the orientation and the front/back are not prescribed in advance and which can be used in any position and any orientation arbitrarily selected by the operator.

According to at least one aspect of the embodiments described above, it is possible to specify the installation positions of the RF coils.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
    a wireless communication device that includes an antenna and that transmits and receives a wireless signal through the antenna;
    a radio frequency (RF) coil that includes a plurality of antennas and that receives the wireless signal and responds to the received wireless signal through each of the plurality of antennas; and
    processing circuitry configured to
        determine positions of the plurality of antennas based on each of response results indicated by responses from the plurality of antennas to the received wireless signal, and
        determine a position and an orientation of the RF coil based on the determined positions of the plurality of antennas.

2. The magnetic resonance imaging apparatus according to claim 1, wherein the processing circuitry is further configured to estimate warping of the RF coil, based on the specified positions of the antennas and a positional relationship among the antennas.

3. The magnetic resonance imaging apparatus according to claim 1, wherein, if the orientation of the RF coil is prescribed in advance, the processing circuitry is configured to determine the position and the orientation of the RF coil based on the orientation of the RF coil prescribed in advance and each of the response results.

4. The magnetic resonance imaging apparatus according to claim 1, wherein
    the RF coil includes a predetermined number of coil elements in prescribed positions that are prescribed in advance with respect to the one or more antennas included in the RF coil, and
    the processing circuitry is further configured to determine positions and orientations of the predetermined number of coil elements, based on the position of the RF coil, the orientation of the RF coil, and the prescribed positions.

5. The magnetic resonance imaging apparatus according to claim 1, wherein the antenna included in the wireless communication device is installed in a position above the position of the RF coil.

6. The magnetic resonance imaging apparatus according to claim 1, wherein the processing circuitry is further configured to determine the position of the RF coil by using a response time period or an attenuation amount of the wireless signal.

7. A magnetic resonance imaging apparatus, comprising:
a wireless communication device that includes an antenna and that transmits and receives a wireless signal through the antenna;
an RF coil that includes an antenna and that receives the wireless signal and responds to the received wireless signal through the antenna; and
processing circuitry configured to determine a position of the RF coil based on a response result indicated by the response from the RF coil, wherein
the antenna included in the RF coil performs at least one of reception of a control signal and transmission of an echo signal, in addition to the receiving of and the responding to the wireless signal.

8. A magnetic resonance imaging apparatus, comprising:
a wireless communication device that includes an antenna and that transmits and receives a wireless signal through the antenna;
an RF coil that includes a plurality of antennas and that receives the wireless signal and responds to the received wireless signal through each of the antennas; and
processing circuitry configured to
determine positions of the plurality of antennas based on each of response results indicated by responses from the plurality of antennas to the wireless signal, and
estimate warping of the RF coil based on the determined positions of the antennas and a positional relationship among the plurality of antennas.

* * * * *